United States Patent
Mizutani et al.

(10) Patent No.: US 6,733,873 B2
(45) Date of Patent: May 11, 2004

(54) POLYESTER FILM AS SUPPORT FOR DRY FILM RESIST

(75) Inventors: Kei Mizutani, Sagamihara (JP); Koji Kubo, Sagamihara (JP)

(73) Assignee: Teijin Limited, Osaka (JP)

( * ) Notice: Subject to any disclaimer, the term of this patent is extended or adjusted under 35 U.S.C. 154(b) by 0 days.

(21) Appl. No.: 10/110,691

(22) PCT Filed: Aug. 15, 2001

(86) PCT No.: PCT/JP01/07043

§ 371 (c)(1),
(2), (4) Date: Apr. 17, 2002

(87) PCT Pub. No.: WO02/16466

PCT Pub. Date: Feb. 28, 2002

(65) Prior Publication Data

US 2002/0197496 A1 Dec. 26, 2002

(30) Foreign Application Priority Data

Aug. 18, 2000 (JP) ........................................ 2000-248502
Aug. 18, 2000 (JP) ........................................ 2000-248503

(51) Int. Cl.$^7$ .................... B32B 27/08; B32B 27/18; B32B 27/20; B32B 27/30; B32B 27/36

(52) U.S. Cl. ...................... 428/216; 428/213; 428/323; 428/336; 428/337; 428/339; 428/480; 428/483; 428/910; 528/275; 528/277; 528/279; 528/283; 528/285; 528/293; 528/295

(58) Field of Search ................................ 428/212, 213, 428/215, 216, 323, 480, 483, 910, 332, 334, 335, 336, 337, 339, 694 ST; 528/275, 293, 295, 277, 279, 283, 285

(56) References Cited

U.S. PATENT DOCUMENTS

| 5,328,770 | A | * | 7/1994 | Yoshida et al. ............. 428/480 |
|---|---|---|---|---|
| 5,648,159 | A | * | 7/1997 | Sato |
| 5,707,782 | A | | 1/1998 | Economy et al. |
| 5,789,528 | A | * | 8/1998 | Martl et al. .................. 528/279 |
| 5,879,854 | A | * | 3/1999 | Tomita et al. ........... 430/272.1 |
| 5,935,761 | A | | 8/1999 | Hwang et al. |
| 6,037,100 | A | | 3/2000 | Yu et al. |
| 6,316,584 | B1 | * | 11/2001 | Seidel et al. ................. 528/279 |

FOREIGN PATENT DOCUMENTS

| EP | 1 035 44 A2 | 9/2000 |
|---|---|---|
| JP | 07-333853 A | 12/1995 |
| WO | WO99/54379 A1 | 10/1999 |

OTHER PUBLICATIONS

Database WPI Section Ch, Week 199938 Derwent Publications Ltd., London GB; AN 1999–455481 XP002224590 & KR 98 043 160 A (Kolon Ind Inc), Sep. 5,1998, Abstract.

Database WPI Section Ch, Week 200028 Derwent Publications Ltd., London GB; AN 2000–321719 XP002224591 & JP 2000 094507 A (Teijin Ltd), Apr. 4, 2000, Abstract.

* cited by examiner

Primary Examiner—Vivian Chen
(74) Attorney, Agent, or Firm—Sughrue Mion, PLLC

(57) ABSTRACT

A polyester film for dry film resists, which satisfies requirements for transparency, particularly transmittance of radiation having a wavelength around 365 nm, slipperiness, winding properties, resolution and recyclability. A polyester film for dry film resists which has a thickness of 10 to 25 μm, a haze value of 3% or less and a residual polycondensation metal catalyst content of less than 150 ppm, and a metal antimony content of 15 mmol % or less based on the total of all the acid components, and a laminated polyester film comprising a lubricating layer on at least one side of the above film.

18 Claims, No Drawings

POLYESTER FILM AS SUPPORT FOR DRY FILM RESIST

FIELD OF THE INVENTION

The present invention relates to a polyester film for dry film resists. More specifically, it relates to a polyester film for dry film resists, which is excellent in terms of transparency, slipperiness, winding properties, separation work efficiency and resolution.

PRIOR ART

In recent years, a dry film resist (may be abbreviated as DFR hereinafter) method has been used to produce a printed wiring circuit board. A photoresist laminate used in this DFR method is generally a laminate structure comprising a base layer, a photoresist layer and a protective layer laminated in the mentioned order and a polyester film having excellent mechanical, chemical and optical properties has been used as the base layer.

The DFR method comprises removing the protective layer of the photoresist laminate having the above structure, joining the exposed photoresist layer to a conductive matrix mounted on a substrate and joining a glass sheet printed with an electronic circuit to the photoresist film base layer. Thereafter, the resulting laminate was exposed to ultraviolet radiation having a wavelength around 365 nm from the glass sheet side to exposure and cure a photosensitive resin constituting the photoresist layer, the glass sheet and the base layer are removed, and an uncured portion of the photoresist layer is removed by a solvent or the like. Further, when etching is carried out with an acid, the exposed conductive matrix dissolves, the photoresist resin reacts, and an unremoved portion of the conductive matrix remains as it is. When the remaining photoresist layer is then removed by suitable means, the conductive matrix layer is formed on the substrate as a circuit.

A polyester film used as the base layer in the above DFR method is required to have high transmission of light having a wavelength around 365 nm and a low haze value. When the photoresist layer is to be exposed, as light passes through the base layer, if the transmission of the base layer is low, the photoresist layer may not be exposed fully or light may be scattered with the result of poor resolution.

In recent years, portable telephones, PHS and personal computers have been in growing demand and the improvement of productivity of photoresist films for the production of electronic circuits for use in these devices has been required.

To improve handling ease for the production of photoresist films or the handling ease of a photoresist film, the polyester film of the base layer is required to have moderate slipperiness, winding properties and tear strength. The method of forming fine protrusions on the surface of a polyester film by containing fine particles in the film has been used to achieve the above properties. JP-A 7-333853 (the term "JP-A" as used herein means an "unexamined published Japanese patent application") proposes a biaxially oriented laminated polyester film for photoresists in which the outermost layer on at least one side contains particles (globular or amorphous silica particles, globular crosslinked polymer particles, etc.) having an average particle diameter of 0.01 to 3.0 μm and has a surface roughness Ra (center line average roughness) of 0.005 μm or more, an Rt (maximum height) of less than 1.5 μm and a film haze of 1.5% or less.

However, this polyester film may be unsatisfactory in terms of transmission of light having a wavelength around 365 nm with the result of reduced resolution, thereby making it difficult to obtain a fine circuit pattern. Further, the above laminated polyester film has a problem such as high production cost.

As the recent enactment of a home electric appliance recycling law promotes the recycling of electric products and products for producing the same, materials constituting these are required to contain no antimony, tin or lead. Antimony compounds have been used as a polycondensation catalyst for producing a polyester polymer for forming a polyester film. Use of polycondensation catalysts other than these antimony compounds is now desired.

SUMMARY OF THE INVENTION

It is an object of the present invention to provide a polyester film for dry film resists, which solves the above problems of the prior art and meets requirements for the transmission of light, especially light having a wavelength around 365 nm, slipperiness, winding properties and resolution.

It is another object of the present invention to provide a polyester film for dry film resists, which further has excellent recyclability in addition to the above properties.

It is still another object of the present invention to provide a laminated polyester film for dry film resists, which prevents reflection and has excellent fine pattern circuit formability in addition to the above properties.

It is a further object of the present invention to provide a dry film resist comprising the above polyester film of the present invention as a base film.

Other objects and advantages of the present invention will become apparent from the following description.

According to the present invention, firstly, the above objects and advantages of the present invention are attained by a biaxially oriented polyester film for dry film resists, which comprises (1) an aromatic polyester containing metals derived from a polycondensation catalyst in a total amount of less than 150 ppm and metal antimony out of the above metals in an amount of 15 mmol % or less based on the total of all the acid components and which has (2) a haze value of 3% or less, (3) a transmission of ultraviolet radiation having a wavelength of 365 nm of 86% or more and (4) a thickness of 10 to 25 μm.

According to the present invention, secondly, the above objects and advantages of the present invention are attained by a laminated polyester film which comprises (1) the above biaxially oriented polyester film of the present invention and a lubricating layer formed on at least one side of the polyester film and which has (2) a haze value of 3% or less and (3) a transmittance of ultraviolet radiation having a wavelength of 365 nm of 86% or more.

According to the present invention, thirdly, the above objects and advantages of the present invention are attained by a dry film resist comprising the biaxially oriented polyester film or laminated polyester film of the present invention, a photoresist layer and a protective film layer laminated in the mentioned order.

DETAILED DESCRIPTION OF THE PREFERRED EMBODIMENTS

The present invention will be described in detail hereinbelow. A description is first given of the biaxially oriented polyester film of the present invention.

The aromatic polyester constituting the film of the present invention is preferably a polyethylene terephthalate homopolymer or a copolymer comprising ethylene terephthalate as the main recurring unit. The polyethylene terephthalate homopolymer is suitably used in a DFR film because it has high mechanical strength and a high transmission of short-wavelength visible radiation and near ultraviolet radiation close to that radiation.

In the present invention, the comonomer of the copolyester may be a dicarboxylic acid component or diol component. Examples of the dicarboxylic acid component include aromatic dicarboxylic acids such as isophthalic acid and phthalic acid; aliphatic dicarboxylic acids such as adipic acid, azelaic acid, sebacic acid and decanedicarboxylic acid; and alicyclic dicarboxylic acids such as cyclohexanedicarboxylic acid. Examples of the diol component include aliphatic diols such as 1,4-butanediol, 1,6-hexanediol and diethylene glycol; alicyclic diols such as 1,4-cyclohexanedimethanol; and aromatic diols such as bisphenol A. They may be used alone or in combination of two or more. Out of these, isophthalic acid is particularly preferred because it gives a copolymer having high transparency and tear strength.

The amount of the comonomer which depends on its type is such that the melting point of the obtained polymer should be 245 to 258° C. (melting point of the homopolymer). When the melting point is lower than 245° C., heat resistance deteriorates, heat shrinkage becomes large and film flatness lowers.

The melting point of the polyester is measured by obtaining a melting peak at a temperature elevation rate of 20° C./min using the 910 DSC of Du Pont Instruments Co., Ltd. The amount of the sample is about 20 mg.

The intrinsic viscosity (orthochlorophenol, 35° C.) of the polyester is preferably 0.52 to 1.50, more preferably 0.57 to 1.00, particularly preferably 0.60 to 0.80. When the intrinsic viscosity is lower than 0.52, the tear strength may be insufficient disadvantageously. When the intrinsic viscosity is higher than 1.50, productivity in the raw material production step and the film formation step may be impaired.

The aromatic polyester such as polyethylene terephthalate or copolyester in the present invention is not limited by its production process. For instance, in the case of terephthalic acid, ethylene glycol and copolyester, a comonomer is further added to carry out an esterification reaction and then the obtained reaction product is polycondensed until a targeted polymerization degree is achieved to produce polyethylene terephthalate or copolyethylene terephthalate; or in the case of dimethyl terephthalate, ethylene glycol and copolyester, a comonomer is added to carry out an ester exchange reaction and then the obtained reaction product is polycondensed until a targeted polymerization degree is achieved to produce polyethylene terephthalate or copolyethylene terephthalate. Polyethylene terephthalate or copolyethylene terephthalate obtained by the above method (melt polymerization) may be further polymerized in a solid state (solid-phase polymerization) as required to produce a polymer having a higher degree of polymerization.

The catalyst used for the above polycondensation reaction is preferably a combination of a titanium compound (Ti compound), germanium compound (Ge compound), manganese compound (Mn compound) and antimony compound (Sb compound), or a magnesium compound (Mg compound). These catalysts may be used alone or in combination. Out of these, a germanium compound and a titanium compound are preferred and a germanium compound is particularly preferred.

Preferred examples of the titanium compound include titanium tetrabutoxide and titanium acetate. Preferred examples of the germanium compound include (a) amorphous germanium oxide, (b) fine crystalline germanium oxide, (c) a solution of germanium oxide dissolved in glycol in the presence of an alkali metal, alkali earth metal or compound thereof and (d) an aqueous solution of germanium oxide. Further, when 10 mmol % or less of an antimony compound and/or a titanium compound are/is used, resolution can be improved and production cost can be reduced advantageously.

The total content of the residual polycondensation metal catalysts in the aromatic polyester is less than 150 ppm, preferably 30 to 120 ppm, more preferably 50 to 100 ppm based on weight. Out of these, the content of metal antimony is 15 mmol % or less, preferably 10 mmol % or less, more preferably 5 mmol % or less, particularly preferably 0 mmol % based on 1 mol of the total of all the acid components.

When the total content of the residual polycondensation metal catalysts in the aromatic polyester is higher than 150 ppm, the transmittance of radiation having a wavelength around 365 nm may become less than 86% based on a film thickness of 16 µm disadvantageously. To reduce the total content of the residual polycondensation metal catalysts in the aromatic polyester to 150 ppm or less, use of an antimony-based catalyst must be avoided, which is preferred from the viewpoint of the home electric appliance recycling law.

The above aromatic polyester may be optionally mixed with additives such as an antioxidant, thermal stabilizer, viscosity modifier, plasticizer, color improving agent, lubricant and nucleating agent.

Out of these, lubricant fine particles are added as the lubricant to secure the work efficiency (slipperiness) of the film. Any lubricant fine particles may be used. Inorganic lubricants include silica, alumina, titanium dioxide, calcium carbonate and barium sulfate. Organic lubricants include silicone resin particles and crosslinked polystyrene particles. Out of these, porous silica particles which are agglomerates of primary particles are particularly preferred. The porous silica particles have a characteristic property to improve the transparency of the film because voids are hardly produced around the particles when the film is stretched.

The average particle diameter of the primary particles constituting the porous silica particles is preferably in the range of 0.001 to 0.1 µm. When the average particle diameter of the primary particles is smaller than 0.001 µm, extremely fine particles produced by the cracking of a slurry agglomerate, causing a reduction in transparency. When the A, average particle diameter of the primary particles is larger than 0.1 µm, the porosity of the particles is lost with the result that the feature that voids are hardly produced may be lost. Further, the pore volume of the agglomerated particle is preferably 0.5 to 2.0 ml/g, more preferably 0.6 to 1.8 ml/g. When the pore volume is smaller than 0.5 ml/g, the porosity of the particles is lost, voids may be produced and transparency may be lowered disadvantageously. When the pore volume is larger than 2.0 ml/g, cracking and agglomeration easily occur, thereby making it difficult to control the diameter of the particle. The average particle diameter of the above porous silica particles is preferably in the range of 0.05 µm or more and less than 3.0 µm, more preferably 0.1 µm to 2.5 µm. The amount of the porous silica particles is preferably 50 ppm or more and less than 1,000 ppm, more preferably 100 ppm to 800 ppm. When the average particle diameter is smaller than 0.05 µm, the amount of the porous silica particles must be increased to obtain high work efficiency, that is, slipperiness of the film, thereby impairing transparency. When the average particle diameter is 3.0 μm or more, resolution may lower and the edge side of a conductor forming a circuit may not be straight but jagged. When the amount of the porous silica particles is smaller than 50 ppm, the effect of providing slipperiness is hardly developed and when the amount is 1,000 ppm or more, transparency may be impaired.

The porous silica may form coarse agglomerated particles such as a particle having an average particle diameter of 10 μm or more. When the number of the coarse agglomerated particles is large, they cause a reduction in resolution and a broken film. To reduce the number of coarse agglomerated particles, a nonwoven filter made of a stainless steel thin wire having a diameter of 15 μm or less and an average opening size of 10 to 30 μm, preferably 13 to 28 μm, more preferably 15 to 25 μm is used as a filter at the time of film formation to filter a molten polymer.

Preferably, the porous silica particles or other lubricant particles are added to a reaction system (preferably as a glycol slurry) during a reaction for the production of a polyester, for example, at any time during an ester exchange reaction or polycondensation reaction in the case of the ester exchange method or at any time in the case of the direct polymerization method. Particularly preferably, the porous silica particles are added to the reaction system in the initial stage of the polycondensation reaction, for example, before the intrinsic viscosity of the polymer reaches about 0.3.

The thickness of the film of the preset invention is preferably 10 μm to 25 μm. It is more preferably 13 μm to 23 μm, more preferably 14 μm to 20 μm. When the thickness is larger than 25 μm, resolution lowers disadvantageously. When the thickness is smaller than 10 μm, strength becomes insufficient and the film is frequently broken at the time of stripping.

The haze value of the film of the present invention is 3% or less, preferably 1.5% or less, more preferably 1.0% or less.

The film of the present invention must have a transmission of ultraviolet radiation having a wavelength of 365 nm of 86% or more. When the transmission is less than 86%, the exposure and curing step of a resist layer may not complete smoothly. The UV transmission of a film having a thickness other than 16 μm is evaluated based on the Lambert-Beer's law to calculate a value based on a thickness of 16 μm from the following equation:

$$log(Io/I) = \epsilon C d$$

wherein Io is the intensity of input light, I is the intensity of transmitted light, $\epsilon$ is an absorptivity coefficient, C is a concentration and d is the thickness of the film (μm).

Preferably, the film of the present invention has a degassing rate between films of 10 to 120 mmHg/hr. When the degassing rate is within the above range, the film is wound smoothly.

The degassing rate between films is obtained by piling up twenty 8 cm×5 cm film pieces cut out from the film, making a regular triangular hole having a side length of 2 mm in the centers of 19 pieces excepting a top piece from the above twenty film pieces and measuring a reduction in mmHg per unit time using a DIG-Thickness Tester (of Toyo Seiki Co., Ltd.).

The above degassing rate can be easily achieved by adding the above-described amount of inert fine particles having the above-described particle diameter to the polyester.

Preferably, the film of the present invention has a thermal shrinkage factor in a longitudinal direction measured at 150° C. of 1.0 to 5.0%. When the thermal shrinkage factor in the longitudinal direction is smaller than 1.0%, the flatness of the film may deteriorate and the transparency of the film may degrade, thereby causing a trouble in the production process of a photoresist film and the production process of an electronic circuit. When the thermal shrinkage factor in the longitudinal direction is larger than 5.0%, the film is readily shrunk and deformed by heat and a solvent in each step.

The film of the present invention can be produced by conventionally known methods. For example, polyethylene terephthalate or copolyethylene terephthalate containing lubricant fine particles is dried, molten, extruded and solidified by quenching on a cooling drum to obtain an unstretched film, biaxially orienting the unstretched film and heat setting the film.

More specifically, this unstretched film is stretched to 3 to 5 times in a longitudinal direction at 70 to 130° C. and then to 3 to 5 times in a transverse direction at 80 to 130° C. and heat set at 190 to 240° C. to obtain a biaxially oriented film. Optionally, a water-dispersible coating is applied to one side or both sides of the film during the above step, for example, after stretching in the longitudinal direction, to form a slippery, or slippery and adhesive coating film as thick as 0.01 to 0.1 μm on the film. Coating is not limited but coating with a reverse roll coater is preferred.

A description is subsequently given of the laminated polyester film of the present invention. The laminated polyester film of the present invention has a lubricating layer formed on at least one side of the above biaxially oriented polyester film of the present invention as described above.

The lubricating layer may comprise (A) a copolyester having a glass transition temperature of 40 to 80° C. and containing a dicarboxylic acid component having a group represented by —SO$_3$M (M is the same equivalent as —SO$_3$— of a metal atom, ammonium group, quaternary organic ammonium group or quaternary organic phosphonium group) in an amount of 8 to 20 mol % based on total of all the dicarboxylic acid components, (B) an acrylic resin having a glass transition temperature of 25 to 70° C., and (C) an inert particle lubricant.

More specifically, the lubricating layer may be formed by applying a 4% aqueous solution (coating solution) which comprises 56 parts by weight of a copolymer P of terephthalic acid, isophthalic acid, 5-Na sulfoisophthalic acid (13 mol % based on the total of all the dicarboxylic acid components), ethylene glycol and neopentylene glycol (Tg= 490° C.), 25 parts by weight of a copolymer S of methyl methacrylate, ethyl acrylate, acrylic acid, methacrylamide and N-methylolacrylamide (Tg=42° C.), 10 parts by weight of a crosslinked acrylic resin filter (diameter of 40 nm) and 9 parts by weight of a copolymer of ethylene oxide and propylene oxide to one side of the above film with a roll coater. The thickness of the layer film is preferably 5 to 200 nm, the most preferably around 90 nm. This film thickness is equivalent to ¼ of the wavelength of ultraviolet radiation for making a resist layer insoluble when exposed thereto and makes reflected light minimum. When the film thickness is smaller than 5 nm, slipperiness and the effect of preventing reflection are hardly obtained. When the thickness is larger than 200 nm, light transmission lowers due to multi-interference.

In the present invention, the lubricating layer can be formed on one side or both sides of the biaxially oriented polyester film of the present invention. When the lubricating layer is formed on both sides, the transmittance of radiation having a wavelength of 365 nm can be increased. However, when the lubricating layer is formed on both sides, the peel strength of the photoresist layer may become high.

Preferably, the inert particle lubricant has an average particle diameter which is smaller than twice the thickness of the lubricating layer. Examples of the inert particles are the same as those listed above.

The laminated polyester film of the present invention has an antimony metal content of preferably 15 mmol % or less, more preferably 10 mmol % or less based on the total of all the acid components.

The laminated polyester film of the present invention must have a transmission of ultraviolet radiation having a wavelength of 365 nm of 86% or more. When the UV transmission is less than 86%, the exposure and curing step of the resist layer may not complete smoothly.

The laminated polyester film of the present invention has a thermal shrinkage factor in a longitudinal direction measured after heating at 150° C. for 30 minutes of preferably 2% or less, more preferably 1.5% or less. When the thermal shrinkage in the longitudinal direction is higher than 2%, wavy wrinkles with mountains and valleys parallel to one another in a longitudinal direction may be formed while the film is processed for DFR application, whereby the flatness of the film may be impaired.

Preferably, the number of flyspecks having a long diameter of 20 μm or more contained in the laminated polyester film of the present invention is preferably 10 or less per 10 cm². The number of flyspecks having a long diameter of 20 μm or more is preferably as small as possible because they prevent light from going straight and cause a circuit defect. Since the flyspecks are generated from foreign matter. undissolved polymer or coarse particles as a nucleus, it is preferred to remove coarse particles and foreign matter by using the above-described nonwoven filter.

It should be understood that the above description of the biaxially oriented polyester film is applied to what is not described of the laminated polyester film directly or with modifications obvious to people of ordinary skill in the art.

Both of the above biaxially oriented polyester film and the laminated polyester film of the present invention are advantageously used as a base layer for the production of a dry film resist as described above.

Therefore, according to the present invention, there are provided a dry film resist comprising the biaxially oriented polyester film of the present invention, a photoresist layer and a protective film layer, and a dry film resist comprising the laminated polyester film of the present invention, a photoresist layer and a protective film layer laminated in the mentioned order, wherein when the laminated polyester film has a lubricating layer on only one side, the photoresist layer is existent on a side devoid of the lubricating layer.

The photoresist layers of the above dry film resists may be formed by applying a photoresist to a base layer in accordance with a method known per se. The protective film is provided to protect the thus formed photoresist layer until the dry film is used.

The photoresist layer in the present invention may be made from a known photosensitive resin composition but preferably it comprises (A) a binder polymer, (B) a photopolymerization initiator and (C) a photopolymerization compound having at least one polymerizable ethylenically unsaturated group in the molecule as essential ingredients, so that the layer can be developed by dilute alkali solution.

Examples of the above binder polymer (A) include an acrylic resin, styrene-based resin, epoxy-based resin, amide-based resin, amide-epoxy-based resin, alkyd-based resin and phenolic resin. An acrylic resin is preferred from the viewpoint of alkali developability. They may be used alone or in combination of two or more.

The above binder polymer may be produced by radical polymerizing a polymerizable monomer. Examples of the above polymerizable monomer include styrene, polymerizable styrene derivatives having a substituent at the α-position or in the aromatic ring, such as α-methylstyrene and vinyltoluene, acrylamides such as diacetone acrylamide, acrylonitrile, vinyl alcohol ethers such as vinyl-n-butyl ether, (meth)acrylic acid alkyl esters, (meth)acrylic acid tetrahydrofurfuryl esters, (meth)acrylic acid dimethyl aminoethyl esters, (meth)acrylic acid diethyl aminoethyl esters, (meth)acrylic acid glycidyl esters, 2,2,2-trifluoroethyl (meth)acrylate, 2,2,3,3-tetrafluoropropyl (meth)acrylate, (meth)acrylic acid, α-bromo(meth)acrylic acid, α-chloro (meth)acrylic acid, β-furyl(meth)acrylic acid, β-styryl (meth)acrylic acid, maleic acid, maleic acid anhydride, maleic acid monoesters such as monomethyl maleate, monoethyl maleate and monoisopropyl maleate, fumaric acid, cinnamic acid, α-cyanocinnamic acid, itaconic acid, crotonic acid and propiolic acid.

Among the above (meth)acrylic acid alkyl esters are compounds represented by the following formula (I) and compounds obtained by substituting the alkyl groups of the compounds with a hydroxyl group, epoxy group or halogen group:

(I)

wherein $R^1$ is a hydrogen atom or methyl group, and $R^2$ is an alkyl group having 1 to 12 carbon atoms. Examples of the alkyl group having 1 to 12 carbon atoms represented by $R^2$ in the above formula (I) include methyl, ethyl, propyl, butyl, pentyl, hexyl, heptyl, octyl, nonyl, decyl, undecyl, dodecyl and structural isomers thereof.

The monomers represented by the above formula (I) include (meth)acrylic acid methyl esters, (meth)acrylic acid ethyl esters, (meth)acrylic acid propyl esters, (meth)acrylic acid butylesters, (meth)acrylic acid pentyl esters, (meth) acrylic acid hexyl esters, (meth)acrylic acid heptyl esters, (meth)acrylic acid octyl esters, (meth)acrylic acid 2-ethylhexyl esters, (meth)acrylic acid nonyl esters, (meth) acrylic acid decyl esters, (meth)acrylic acid undecyl esters and (meth)acrylic acid dodecyl esters. They may be used alone or in combination of two or more.

The above binder polymer (A) preferably contains a carboxyl group from the viewpoint of alkali developability and may be produced, for example, by radical polymerizing a polymerizable monomer having a carboxyl group and another polymerizable monomer. The binder polymer (A) preferably contains styrene or a styrene derivative as the polymerizable monomer from the viewpoint of flexibility.

The above binder polymers (A) may be used alone or in combination of two or more.

Examples of the above photopolymerization initiator (B) include aromatic ketones (such as benzophenone, 4,4'-bisdimethylaminobenzophenone (Michler's ketone), 4,4'-bisdiethylaminobenzophenone, 4-methoxy-4'-dimethylaminobenzophenone, 2-ethylanthraquinone and phenanthrenequinone), benzoin ethers (such as benzoin methyl ether, benzoin ethyl ether and benzoin phenyl ether), benzoins (such as methyl benzoin and ethyl benzoin), benzyl derivatives (such as benzyl dimethyl ketal), 2,4,5-triarylimidazole dimers (such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5- diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer), and acridine derivatives (such as 9-phenylacridine and 1,7-bis(9,9'-acridinyl) heptane). They may be used alone or in combination of two or more.

Examples of the above photopolymerization compound having at least one polymerizable ethylenically unsaturated group in the molecule (C) include compounds obtained by reacting a polyhydric alcohol with an α,β-unsaturated carboxylic acid, compounds obtained by reacting a 2,2-bis(4-((meth)acryloxypolyethoxy)phenyl)propane and a glycidyl group-containing compound with an α,β-unsaturated carboxylic acid, urethane monomers, nonylphenyl dioxylene (meth)acrylate, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate and (meth)acrylic acid alkyl esters.

The above compounds obtained by reacting a polyhydric alcohol with an α,β-unsaturated carboxylic acid include polyethylene glycol di(meth)acrylates having 2 to 14 ethylene groups, polypropylene glycol di(meth)acrylates having 2 to 14 propylene groups, trimethylolpropane di(meth)acrylate, trimethylolpropane tri(meth)acrylate, trimethylolpropane ethoxy tri(meth)acrylate, trimethylolpropane diethoxy tri(meth)acrylate, trimethylolpropane triethoxy tri(meth)acrylate, trimethylolpropane tetraethoxy tri(meth)acrylate, trimethylolpropane pentaethoxy tri(meth)acrylate, tetramethylolmethane tri(meth) acrylate, tetramethylolmethane tetra(meth)acrylate, polypropylene glycol di(meth)acrylates having 2 to 14 propylene groups, dipentaerythritol penta(meth) acrylate and dipentaerythritol hexa(meth)acrylate.

Examples of the above α,β-unsaturated carboxylic acid include (meth)acrylic acid. Examples of the above 2,2-bis(4-((meth)acryloxypolyethoxy)phenyl) propane include 2,2-bis(4-((meth)acryloxydiethoxy)phenyl)propane, 2,2-bis(4-((meth)acryloxytriethoxy)phenyl)propane, 2,2-bis(4-((meth)acryloxypentaethoxy)phenyl)propane and 2,2-bis(4-((meth)acryloxydecaethoxy)phenyl. 2,2-bis(4-(methacryloxypentaethoxy)phenyl)propane is commercially available under the name of BPE-500 (trade name of Shin Nakamura Kagaku Kogyo Co., Ltd.).

Examples of the above glycidyl group-containing compound include trimethylolpropane triglycidyl ether tri(meth)acrylate and 2,2-bis(4-(meth)acryloxy-2-hydroxypropyloxy)phenyl. The above urethane monomers include addition reaction products of a (meth)acryl monomer having an OH group at the β-position and isophorone diisocyanate, 2,6-toluene diisocyanate, 2,4-toluene diisocyanate or 1,6-hexamethylene diisocyanate, tris((meth)acryloxy tetraethylene glycol isocyanate)hexamethylene isocyanurate, EO modified urethane di(meth)acrylates and EO and PO modified urethane di(meth)acrylates. EO stands for ethylene oxide and the EO modified compounds have the block structure of an ethylene oxide group. PO stands for propylene oxide and the PO modified compounds have the block structure of a propylene oxide group.

The above (meth)acrylic acid alkyl esters include (meth)acrylic acid methyl esters, (meth)acrylic acid ethyl esters, (meth)acrylic acid butyl esters and (meth)acrylic acid 2-ethylhexyl esters. They may be used alone or in combination of two or more.

In the present invention, the amount of the component (A) is preferably 40 to 80 parts by weight based on 100 parts by weight of the total of the components (A) and (C). When the amount is smaller than 40 parts by weight, an optically cured product readily becomes brittle and if it is used as a photosensitive element, coatability may deteriorate. When the amount is larger than 80 parts by weight, sensitivity may become insufficient.

The amount of the component (B) is preferably 0.1 to 20 parts by weight based on 100 parts by weight of the total of the components (A) and (C). When the amount is smaller than 0.1 part by weight, sensitivity may become insufficient and when the amount is larger than 20 parts by weight, absorption by the surface of the composition upon exposure increases, whereby the optical curing of the interior may become unsatisfactory.

The amount of the component (C) is preferably 20 to 60 parts by weight based on 100 parts by weigh of the total of the components (A) and (C). When the amount is smaller than 20 parts by weight, sensitivity may become insufficient and when the amount is larger than 60 parts by weight, an optically cured product may become brittle.

The photosensitive resin composition in the present invention may optionally contain a dye such as Malachite Green, optically color developing agent such as tribromophenyl sulfone or leucocrystal violet, thermal color development preventing agent, plasticizer such as p-toluene sulfonamide, pigment, filler, antifoamer, flame retardant, stabilizer, adhesion providing agent, leveling agent, release promoting agent, antioxidant, perfume, imaging agent and thermal crosslinking agent in an amount of 0.01 to 20 parts by weight each based on 100 parts by weight of the total of the components (A) and (C). They may be used alone or in combination of two or more.

The photosensitive resin composition of the present invention may be dissolved in a solvent such as methanol, ethanol, acetone, methyl ethyl ketone, methyl cellosolve, ethyl cellosolve, toluene, N-dimethyl formamide or propylene glycol monomethyl ether, or a mixed solvent thereof and applied as a solution having a solid content of 30 to 60 wt %.

The thickness of the photoresist layer which differs according to application purpose is preferably 1 to 100 μm, more preferably 3 to 100 μm, particularly preferably 5 to 100 μm after it is dried.

The flowability of the photoresist layer is preferably 50 to 500 μm, more preferably 100 to 300 μm, particularly preferably 100 to 250 μm from the viewpoints of followability to an adherent such as a substrate, low deformability of the photoresist layer and low edge fusibility. The flowability can be controlled to the above range by adjusting the type and amount of each component constituting the photoresist layer. The flowability is defined as $T_1-T_2$ (μm) when a photoresist layer having a diameter of 20 mm and a thickness of 2 mm is used as a sample, this sample is placed on a flat substrate, a 5 kg cylindrical static load having a diameter of 50 mm is applied to the sample, and the thickness ($T_1$ μm) of the deforming photoresist layer after 10 seconds and the thickness ($T_2$ μm) of the photoresist layer after 900 seconds are measured.

EXAMPLES

The following examples are given to further illustrate the present invention. Various physical property values and characteristic properties in the present invention were measured and defined as follows.

(1) Determination Analysis of Antimony

The film is melt molded to manufacture a plate having a diameter of 5 cm and a thickness of 3 mm and the amount of antimony is determined by measuring it with fluorescent X-radiation (RIX3000 of Rigaku Denki Co., Ltd.). The used X-ray bulb is preferably a Cr or Rh bulb but other X-ray bulbs may be used if they can determine the amount of antimony. Determination analysis is carried out by drawing a calibration curve from a sample whose amount of antimony is already known (axis of abscissa: amount of antimony, axis of ordinates: detected amount of antimony at the time of analysis (unit: cps)) and determining the amount of antimony from the detected amount (unit: cps) of antimony contained in an unknown sample.

(2) Average Particle Diameter of Particles

This is measured using the CP-50 centrifugal particle size analyzer of Shimadzu Corporation. The particle diameter equivalent to 50 mass percent is read from the accumulative curve of the particle diameter and amount of particles of each size calculated from the obtained centrifugal sedimentation curve and taken as the above average particle diameter ("Particle Size Measurement Technology" published by Nikkan Kogyo Shimbun Co., Ltd., pp. 242–247, 1975).

When the inert fine particles as a lubricant added are secondary particles which are agglomerates of primary particles, the particle diameter obtained by the above average particle diameter measuring method may be smaller than the actual average particle diameter. Therefore, the following method is employed.

Agglomerates (secondary particles) of particles contained in a super thin piece having a thickness in a sectional direction of 100 nm obtained from the film containing the particles are observed through a transmission electron microscope (for example, the JEM-1200EX of JEOL Ltd.) at a magnification of about ×10,000. Using this microphotograph, the diameters equivalent to the area of a circle of 1,000 particles are measured with an image analyzer and the number average particle diameter of these particles is taken as average secondary particle diameter. The type of the particles may be identified by the quantitative analysis of a metal element by SEM-XMA or ICP. The average primary particle diameter is measured in accordance with the method of measuring average secondary particle diameter except that the particles are imaged by a transmission electron microscope at a magnification of ×100,000 to ×1,000,000.

(3) Film Thickness

The thickness of the film is measured at 100 points by an external micrometer and the average of the measurement values is obtained as the thickness of the film.

(4) Degassing Rate of Film

The winding properties of the film is expressed by degassing time when the films overlap with one another. The degassing rate is obtained by piling up twenty 8 cm×5 cm film pieces cut out from the film, making a regular triangular hole having a side length of 2 mm in the centers of 19 pieces excepting a top piece from the above twenty film pieces and measuring a reduction in mmHg per unit time using a DIG-Thickness Tester (of Toyo Seiki Co., Ltd.).

(5) UV Transmission

The transmission of ultraviolet radiation having a wavelength of 365 nm is measured with the MPC-3100 spectrophotometer of Shimadzu Corporation.

(6) Haze Value

The haze value of the film is measured with the NDH-20 haze meter of Nippon Denshoko Kogyo Co., Ltd. This is measured in accordance with JIS P-8116.

(7) Thermal Shrinkage Factor

The film whose length has been measured accurately is placed in a thermostatic chamber set to 150° C. under no tension, kept there for 30 minutes, taken out from the chamber and returned to normal temperature to read its dimensional change. The thermal shrinkage factor of the film is obtained from the following equation when the length before the heat treatment is represented by $L_0$ and the length after the heat treatment is represented by L.

$$\text{thermal shrinkage}=(L_0-L) \times 100/L_0 \ (\%)$$

(8) Melting Point

This is measured by obtaining a melting peak at a temperature elevation rate of 20° C./min using the 910 DSC of Du Pont Instruments Co., Ltd. The amount of the sample is about 20 mg.

(9) Characteristic Properties of Photoresist Film

The obtained photoresist film is used to manufacture a printed circuit so as to evaluate its resolution and circuit defect. That is, the photoresist layer of the photoresist film whose protective layer has been removed is joined to a copper sheet formed on a glass fiber-containing epoxy resin plate, a glass sheet printed with a circuit is joined to the photoresist film, the obtained assembly is exposed to ultraviolet radiation from the glass sheet side, the photoresist film is removed, the resin plate is washed and etched to form a circuit, and resolution and a circuit defect are observed visually and through a microscope to evaluate the characteristic properties of the photoresist film based on the following criteria.

(a) resolution

⊚: resolution is extremely high and a clear circuit is obtained

◯: resolution is high and a clear circuit is obtained

Δ: clearness is slightly low and a phenomenon such as a bold line is seen

X: clearness is low and a practically usable circuit cannot be obtained (b) circuit defect ◯: no circuit defect is observed Δ: some circuit defects are observed X: a large number of circuit defects are observed and the circuit cannot be used Example 1

Dimethyl terephthalate and ethylene glycol were polymerized in accordance with a commonly used method by adding manganese acetate as an ester exchange catalyst, germanium oxide as a polymerization catalyst, phosphorous acid as a stabilizer and 0.066 wt % based on the polymer of porous particles having an average particle diameter of 1.7 $\mu$m as lubricant agglomerated particles to obtain polyethylene terephthalate having an intrinsic viscosity (orthochlorophenol, 35° C.) of 0.65. A pellet of this polyethylene terephthalate was dried at 170° C. for 3 hours, supplied to an extruder, molten at a temperature of 295° C., filtered with a nonwoven filter having an average opening size of 24 $\mu$m and made of a stainless steel thin wire having a diameter of 13 $\mu$m, and extruded from a T die onto a rotary cooling drum having a surface finish of about 0.3 s and a surface temperature of 20° C. to obtain a 225 $\mu$m-thick unstretched film. The thus obtained unstretched film was preheated at 75° C., stretched to 3.6 times between a low-speed roller and a high-speed roller by heating with a single infrared heater having a surface temperature of 800° C. from 15 mm above, quenched and supplied to a stenter to be stretched to 3.9 times in a transverse direction at 120° C. The obtained biaxially oriented film was heat set at 205° C.

for 5 seconds to obtain a 16 μm-thick biaxially oriented polyester film. A photoresist layer and a protective layer were formed on one side of this film to manufacture a printed circuit so as to evaluate its characteristic properties. The evaluation results of the printed circuit and the characteristic properties of the film alone are shown in Table 1.

Example 2

A 19 μm-thick biaxially oriented polyester film made from polyethylene terephthalate was obtained in the same manner as in Example 1. A photoresist layer and a protective layer were formed on this film to manufacture a printed circuit so as to evaluate its characteristic properties. The evaluation results of the printed circuit and the characteristic properties of the film alone are shown in Table 1.

Example 3

A 14 μm-thick biaxially oriented polyester film was obtained in the same manner as in Example 1 except that antimony trioxide was added to a catalyst of Example 1 in an amount shown in Table 1 and the following coating solution was applied to one side of the film stretched in a longitudinal direction as a lubricant coating to a thickness of 0.05 μm after drying and stretching in a transverse direction. A photoresist layer and a protective layer were formed on one side of this film to manufacture a printed circuit so as to evaluate its characteristic properties. The evaluation results of the printed circuit and the characteristic properties of the film alone are shown in Table 1.

coating solution: a 4% aqueous solution comprising 56 parts by weight of a copolymer P of terephthalic acid, isophthalic acid, 5-Na sulfoisophthalic acid (13 mol % based on the total of all the dicarboxylic acid components), ethylene glycol and neopentylene glycol (Tg=49° C.), 25 parts by weight of a copolymer S of methyl methacrylate, ethyl acrylate, acrylic acid, methacrylamide and N-methylolacrylamide (Tg=42° C.), 10 parts by weight of a crosslinked acrylic resin filter (diameter of 40 nm) and 9 parts by weight of a copolymer of ethylene oxide and propylene oxide.

Example 4

A 12 μm-thick biaxially oriented polyester film was obtained in the same manner as in Example 1 except that polyethylene terephthalate obtained by copolymerizing 3 mol % of isophthalic acid was used and a lubricant shown in Table 1 was added. A photoresist layer and a protective layer were formed on this film to manufacture a printed circuit so as to evaluate its characteristic properties. The evaluation results of the printed circuit and the characteristic properties of the film alone are shown in Table 1.

Not shown in the table, the degassing rates of Examples 1 to 4 were in the range of 30 to 100 mmHg/hr advantageously.

Comparative Example 1

An unstretched film was obtained in the same manner as in Example 1 except that antimony trioxide was used as a condensation catalyst. This unstretched film was preheated at 75° C., stretched to 3.6 times between a low-speed roller and a high-speed roller by heating with a single infrared heater having a surface temperature of 800° C. from 15 mm above, quenched and supplied to a stenter to be stretched to 3.9 times in a transverse direction at 120° C. The obtained biaxially oriented film was heat set at 205° C. for 5 seconds to obtain a 16 μm-thick biaxially oriented polyester film. A photoresist layer and a protective layer were formed on one side of this film to manufacture a printed circuit so as to evaluate its characteristic properties. The evaluation results of the printed circuit and the characteristic properties of the film alone are shown in Table 1. When this film was used as a base film for a photoresist, it deteriorated the quality of a printed board due to poor resolution.

Comparative Examples 2 to 4

Polyethylene terephthalate films having thicknesses shown in Table 1 were obtained in the same manner as in Example 1 except that lubricants shown in Table 1 were used. A photoresist layer and a protective layer were formed on these films to manufacture printed circuits so as to evaluate their characteristic properties. The evaluation results of the printed circuits and the characteristic properties of the films alone are shown in Table 1.

The same coating as in Example 3 was applied to one side of the film after stretching in a longitudinal direction in Comparative Example 4

The film of Comparative Example 2 had a high haze value, low resolution and a circuit defect.

The film of Comparative Example 3 was too thick and had low resolution.

The film of Comparative Example 4 was too thin and broke frequently when it was separated from a resist. Therefore, a printed circuit could not be manufactured.

Comparative Example 5

An attempt was made to produce a film in the same manner as in Example 1 except that polyethylene terephthalate obtained by copolymerizing 23 mol % of isophthalic acid was used and a catalyst shown in Table 1 was used. However, break occurred frequently during film formation and it was difficult to manufacture a printed circuit.

TABLE 1

| | polyester composition | melting point of polyester ° C. | content of residual catalyst in film ppm | content of Sb in film mmol % | lubricant type | average particle diameter (μm) | amount ppm | existence of slippery layer | thickness μm | haze value % | UV transmission % | characteristic properties of photoresist film resolution | circuit defect |
|---|---|---|---|---|---|---|---|---|---|---|---|---|---|
| Ex. 1 | PET | 258 | 100 | 0 | porous silica | 1.7 | 660 | nonexistent | 16 | 2.3 | 88.1 | ○ | ○ |
| Ex. 2 | PET | 258 | 100 | 0 | porous silica | 1.7 | 660 | nonexistent | 19 | 2.6 | 87.1 | ○ | ○ |
| Ex. 3 | PET | 258 | 140 | 10 | porous silica | 1.7 | 330 | existent | 14 | 1.4 | 88.2 | ○ | ○ |
| Ex. 4 | PET/IA$_3$ | 250 | 120 | 0 | porous silica | 2.3 | 720 | nonexistent | 12 | 3.2 | 86.8 | ○ | ○ |
| C. Ex. 1 | PET | 258 | 300 | 20 | porous silica | 1.7 | 660 | nonexistent | 16 | 2.4 | 85.4 | X | ○ |

TABLE 1-continued

| | | content of residual catalyst | content of Sb in film | lubricant | | | existence of slippery layer | thickness μm | haze value % | UV transmission % | characteristic properties of photoresist film | |
|---|---|---|---|---|---|---|---|---|---|---|---|---|
| | melting point of polyester °C. | | | | average particle | | | | | | | |
| polyester composition | | in film ppm | mmol % | type | diameter (μm) | amount ppm | | | | | resolution | circuit defect |
| C. Ex. 2 | PET | 258 | 120 | 0 | kaolin clay | 0.6 | 2500 | nonexistent | 16 | 6.0 | 84.3 | X | X |
| C. Ex. 3 | PET | 258 | 100 | 0 | porous silica | 1.7 | 660 | nonexistent | 38 | 3.5 | 85.8 | X | Δ |
| C. Ex. 4 | PET | 258 | 100 | 0 | porous silica | 0.5 | 300 | existent | 8 | 0.9 | 88.4 | — | — |
| C. Ex. 5 | PET/IA$_{23}$ | 198 | 200 | 15 | porous silica | 1.7 | 660 | nonexistent | 16 | 3.6 | 81.2 | — | — |

Ex.: Example
C. Ex.: Comparative Example
PET: polyethylene terephthalate
IAn: containing n mol % of isophthalic acid
Sb: antimony Example 5

Dimethyl terephthalate and ethylene glycol were polymerized by adding manganese acetate as an ester exchange catalyst, germanium oxide as a polymerization catalyst, phosphorous acid as a stabilizer, 25 ppm based on the polymer of porous silica particles having an average particle diameter of 1.7 μm and 80 ppm based on the polymer of globular silica having an average particle diameter of 0.12 μm as lubricant agglomerated particles in accordance with a commonly used method to obtain polyethylene terephthalate having an intrinsic viscosity (orthochlorophenol, 35° C.) of 0.65. A pellet of this polyethylene terephthalate was dried at 170° C. for 3 hours, supplied to an extruder, molten at a temperature of 295° C., filtered with a nonwoven filter having an average opening size of 24 μm and made of a stainless steel thin wire having a diameter of 13 μm, and extruded from a T die onto a rotary cooling drum having a surface finish of about 0.3 s and a surface temperature of 20° C. to obtain a 225 μm-thick unstretched film. The thus obtained unstretched film was preheated at 75° C. and stretched to 3.6 times between a low-speed roller and a high-speed roller by heating with a single infrared heater having a surface temperature of 800° C. from 15 mm above, the following coating solution was applied to one side of the film stretched in a longitudinal direction as a lubricant coating to a thickness of 40 nm after drying and stretching in a transverse direction, and the coated film was then supplied to a stenter to be stretched to 3.9 times in a transverse direction at 120° C. The obtained biaxially oriented film was heat set at 230° C. for 5 seconds to obtain a 16 μm-thick biaxially oriented polyester film. A photo resist layer and a protective layer were formed on one side devoid of the lubricating coating film of this film to manufacture a printed circuit so as to evaluate its characteristic properties. The evaluation results of the printed circuit and the characteristic properties of the film alone are shown in Table 2.
coating solution: a 4% aqueous solution comprising 56 parts by weight of a copolymer P of terephthalic acid, isophthalic acid, 5-Na sulfoisophthalic acid (13 mol % based on the total of all the dicarboxylic acid components), ethylene glycol and neopentylene glycol (Tg=49° C.), 25 parts by weight of a copolymer S of methyl methacrylate, ethyl acrylate, acrylic acid, methacrylamide and N-methylolacrylamide (Tg=42° C.), 10 parts by weight of a crosslinked acrylic resin filter (diameter of 40 nm) and 9 parts by weight of a copolymer of ethylene oxide and propylene oxide.

Example 6

A 23 μm-thick biaxially oriented polyester film made from polyethylene terephthalate was obtained in the same manner as in Example 5. A photoresist layer and a protective layer were formed on one side devoid of a lubricant of this film to manufacture a printed circuit so as to evaluate its characteristic properties. The evaluation results of the printed circuit and the characteristic properties of the film alone are shown in Table 2.

Example 7

A 19 μm-thick biaxially oriented polyester film was obtained in the same manner as in Example 5. A photoresist layer and a protective layer were formed on one side devoid of a lubricating layer of this film to manufacture a printed circuit so as to evaluate its characteristic properties. The evaluation results of the printed circuit and the characteristic properties of the film alone are shown in Table 2.

Example 8

A 12 μm-thick biaxially oriented polyester film was obtained in the same manner as in Example 5 except that polyethylene terephthalate containing 3 mol % of isophthalic acid was used and a lubricant shown in Table 2 was added. A photoresist layer and a protective layer were formed in this film to manufacture a printed circuit so as to evaluate its characteristic properties. The evaluation results of the printed circuit and the characteristic properties of the film alone are shown in Table 2.

The degassing rates of the films of Examples 1 to 4 were in the range of 30 to 100 mmHg/hr advantageously. The thermal shrinkage factors after the films were heated at 150° C. for 30 minutes were less than 2% in both longitudinal and transverse directions.

Comparative Example 6

A 225 μm-thick unstretched film was obtained in the same manner as in Example 5 except that only porous silica having an average particle diameter of 1.7 μm was used in an amount of 660 ppm. This unstretched film was preheated at 75° C. and stretched to 3.6 times between a low-speed roller and a high-speed roller by heating with a single infrared heater having a surface temperature of 800° C. from 15 mm above, the above coating solution was applied to one side of the film stretched in a longitudinal direction as a lubricant coating to a thickness of 40 nm after drying and stretching in a transverse direction, and the coated film was supplied to a stenter to be stretched to 3.9 times in a- transverse direction at 120° C. The obtained biaxially oriented film was heat set at 205° C. for 5 seconds to obtain a 16 μm-thick biaxially oriented polyester film. A photoresist layer and a protective layer were formed on a side devoid of the lubricant of this film to manufacture a printed circuit so as to evaluate its characteristic properties. The evaluation results of the printed circuit and the characteristic properties of the film are shown in Table 2. When this film was used in DFR, it deteriorated the quality of a printed board due to poor resolution.

The evaluation results of the printed circuit and the characteristic properties of the film are shown in Table 2. The film had low resolution and a circuit defect.

Comparative Example 10

A 9 μm-thick polyester film having a lubricating layer on both sides was obtained using the polymer and lubricant shown in Table 2. The film broke when it was separated from a photoresist layer and could not be evaluated.

TABLE 2

| | | lubricant | | | | lubricating layer | | | UV | characteristic properties of | | |
| | content of Sb in | | average particle | | | thick- | thick- | haze | trans- | photoresist film | | |
| polyester composition | film mmol % | type | diameter μm | amount ppm | side | ness nm | ness μm | value % | mission % | reso- lution | circuit defect | releasability |
|---|---|---|---|---|---|---|---|---|---|---|---|---|
| Ex. 5 | PET | 0 | porous silica globular silica | 1.7 0.12 | 25 80 | one side | 40 | 16 | 0.3 | 88 | ○ | ○ | ○ |
| Ex. 6 | PET | 0 | porous silica globular silica | 1.7 0.2 | 20 70 | one side | 40 | 23 | 0.5 | 88 | ○ | ○ | ○ |
| Ex. 7 | PET | 0 | porous silica globular silica | 1.7 0.12 | 23 75 | one side | 40 | 19 | 0.4 | 87 | ○ | ○ | ○ |
| Ex. 8 | PET/IA$_3$ | 0 | porous silica globular silica | 2.3 0.1 | 30 80 | one side | 90 | 12 | 0.4 | 88 | ○ | ○ | ○ |
| C. Ex. 6 | PET | 0 | porous silica — | 1.7 | 660 | one side | 40 | 16 | 1.8 | 85 | Δ | ○ | ○ |
| C. Ex. 7 | PET | 20 | porous silica globular silica | 1.7 0.12 | 25 80 | none | — | 23 | 0.3 | 82 | X | Δ | ○ |
| C. Ex. 8 | PET | 0 | kaolin clay — | 0.6 | 2500 | one side | 40 | 16 | 3.5 | 79 | X | X | ○ |
| C. Ex. 9 | PET | 0 | porous silica globular silica | 1.7 0.12 | 25 80 | one side | 40 | 30 | 1.4 | 85 | X | Δ | ○ |
| C. Ex. 10 | PET/IA$_{12}$ | 0 | porous silica globular silica | 4.1 0.1 | 25 80 | both sides | 90 | 9 | 1.6 | 89 | — | — | X |

Ex.: Example
C. Ex.: Comparative Example
PET: polyethylene terephthalate
IAn: containing n mol % of isophthalic acid
Sb: antimony Comparative Example 7

A 23 μm-thick polyethylene terephthalate film was obtained in the same manner as in Example 5 except that antimony trioxide was used as a catalyst and a lubricating layer was not applied. A photoresist layer and a protective layer were formed on this film to manufacture a printed circuit so as to evaluate its characteristic properties. The evaluation results of the printed circuit and the characteristic properties of the film are shown in Table 2. The transmission of ultraviolet radiation having a wavelength of 365 nm could not reach a target value.

Comparative Example 8

Kaolin clay was used as a lubricant. The film had a too large haze value and a circuit defect.

Comparative Example 9

A film was formed in the same manner as in Example 5 except that its thickness was changed to 30 μm, and a photoresist layer and a protective layer were formed on a side devoid of a lubricant of this film to manufacture a printed circuit so as to evaluate its characteristic properties.

As described above, according to the present invention, the polyester film of the present invention satisfies requirements for UV transmission, winding properties and conveyance work efficiency at the same time, makes it possible to produce a defect-free circuit with high resolution when it is used in a fine pattern photoresist, can obtain high production yield and accordingly has a high industrial value.

What is claimed is:

1. A biaxially oriented polyester film for dry film resists, which comprises (1) an aromatic polyester containing metals derived from a polycondensation catalyst in a total amount of less than 150 ppm based on weight and antimony out of the above metals in an amount of 15 mmol % or less based on the total of all the acid components and which has (2) a haze value of 3% or less, (3) a transmittance of ultraviolet radiation having a wavelength of 365 nm of 86% or more and (4) a thickness of 10 to 25 μm.

2. The biaxially oriented polyester film of claim 1 in which the metal(s) derived from a polycondensation catalyst is (are) at least one metal selected from the group consisting of titanium, germanium, manganese, antimony and magnesium.

3. The biaxially oriented polyester film of claim 1, wherein the metal(s) derived from a polycondensation catalyst is (are) contained in an amount of 30 to 120 ppm based on weight.

4. The biaxially oriented polyester film of claim 1 which contains metal antimony in an amount of about 0 mmol % based on the total of all the acid components.

5. The biaxially oriented polyester film of claim 1 which has a haze value of 1.5% or less.

6. The biaxially oriented polyester film of claim 1 which has a transmittance of ultraviolet radiation having a wavelength of 365 nm of 86 to 93%.

7. The biaxially oriented polyester film of claim 1 which has a thickness of 13 to 23 µm.

8. The biaxially oriented polyester film of claim 1 which further contains inert particles having an average particle diameter of 0.05 to 3.0 µm in an amount of 50 ppm or more and less than 1,000 ppm.

9. A laminated polyester film which comprises (1) the biaxially oriented polyester film of claim 1 and a lubricating layer formed on at least one side of the polyester film and which has (2) a haze value of 3% or less and (3) a transmittance of ultraviolet radiation having a wavelength of 365 nm of 86% or more.

10. The laminated polyester film of claim 9, wherein the lubricating layer comprises (A) a copolyester having a glass transition temperature of 40 to 80° C. and containing a dicarboxylic acid component having a group represented by —$SO_3M$ (M is the same equivalent as —$SO_3^-$ of a metal atom, ammonium group, quaternary organic ammonium group or quaternary organic phosphonium group) in an amount of 8 to 20 mol % based on total of all the dicarboxylic acid components, (B) an acrylic resin having a glass transition temperature of 25 to 70° C., and (C) an inert particle lubricant.

11. The laminated polyester film of claim 10, wherein the average particle diameter of the inert particle lubricant is smaller than twice the thickness of the lubricating layer.

12. The laminated polyester film of any one of claims 9 to 11, wherein the lubricating layer has a thickness of 5 to 200 nm.

13. The laminated polyester film of claim 9 which contains metal antimony in an amount of 15 mmol % or less based on the total of all the acid components.

14. The laminated polyester film of claim 9, wherein the number of flyspecks having a long diameter of 20 µm or more is 0 to 10 per 10 $cm^2$ of the film plane.

15. The laminated polyester film of claim 9 which has a thermal shrinkage factor in a longitudinal direction after 30 minutes of a heat treatment at 150° C. of 2% or less.

16. The laminated polyester film of claim 9 which has a thermal shrinkage factor in a transverse direction after 30 minutes of a heat treatment at 150° C. of 2% or less.

17. A dry film resist comprising the laminated polyester film of claim 9, a photoresist layer and a protective film layer formed in the mentioned order, wherein when the laminated polyester film has a lubricating layer on only one side, the photoresist layer is existent on a side devoid of the lubricating layer.

18. A dry film resist comprising the biaxially oriented polyester film of claim 1, a photoresist layer and a protective film layer formed in the mentioned order.

* * * * *